United States Patent
Ohashi et al.

(10) Patent No.: US 7,015,848 B2
(45) Date of Patent: Mar. 21, 2006

(54) RECORDING/REPRODUCING APPARATUS USING REFERENCE OSCILLATOR FOR DIGITAL AUDIO

(75) Inventors: Masamichi Ohashi, Tokyo (JP); Masamichi Tsuchiya, Gotenba (JP)

(73) Assignee: Nippon Sogo Seisaku Co. Ltd., Tokyo (JP)

( * ) Notice: Subject to any disclaimer, the term of this patent is extended or adjusted under 35 U.S.C. 154(b) by 0 days.

(21) Appl. No.: 10/503,980

(22) PCT Filed: Feb. 10, 2003

(86) PCT No.: PCT/JP03/01389

§ 371 (c)(1),
(2), (4) Date: Apr. 26, 2005

(87) PCT Pub. No.: WO03/069618

PCT Pub. Date: Aug. 21, 2003

(65) Prior Publication Data

US 2005/0174276 A1    Aug. 11, 2005

(30) Foreign Application Priority Data

Feb. 12, 2002    (JP)    ............................. 2002-034035

(51) Int. Cl.
*H03M 1/00*    (2006.01)
(52) U.S. Cl. .............................. 341/155; 360/1; 360/39
(58) Field of Classification Search ................ 341/110, 341/155; 360/1, 39
See application file for complete search history.

(56) References Cited

U.S. PATENT DOCUMENTS

| | | | | |
|---|---|---|---|---|
| 3,629,582 A | * | 12/1971 | Koehler et al. | ........ 250/363.01 |
| 4,899,117 A | | 2/1990 | Vig | |
| 5,155,695 A | * | 10/1992 | Stein | ........................... 702/178 |
| 5,296,884 A | * | 3/1994 | Honda et al. | ................ 396/311 |

FOREIGN PATENT DOCUMENTS

| JP | 54-109413 | 8/1979 |
|---|---|---|
| JP | 90-73728 | 3/1997 |
| JP | 2000-183430 | 6/2000 |
| JP | 2001-217708 | 8/2001 |
| JP | 2001217708 A * | 8/2001 |

* cited by examiner

*Primary Examiner*—Howard Williams
(74) *Attorney, Agent, or Firm*—R. Neil Sudol; Henry D. Coleman; William J. Sapone

(57) ABSTRACT

A recording/reproducing method and an apparatus for carrying out the same are disclosed wherein a cesium atomic clock, a hydrogen atomic clock or a mercury atomic clock (1) is used as a digital audio reference oscillator so as to minimize jitter which may occur during a recording process performed after analog-to-digital conversion or digital-to-digital conversion, or during digital-to-analog conversion. With the jitter thus minimized, acoustic characteristics including jitter noise and sound resolution are greatly improved, and a sound can be reproduced with high sound quality and high fidelity that are comparable to those achieved in an analog audio system.

6 Claims, 3 Drawing Sheets

RECORDING/REPRODUCING APPARATUS USING REFERENCE OSCILLATOR FOR DIGITAL AUDIO

This application is a 371 of PCT/JP03/01389 Feb. 10, 2003.

TECHNICAL FIELD

The present invention relates to a method of and an apparatus for recording and/or reproducing digital audio information using a reference oscillator incorporated in a clock generator for use with a digital audio device or equipment.

BACKGROUND ART

Conventionally, clock generators used in digital audio equipment in the acoustic art generally rely on the use of a quartz oscillator in performing analog-to-digital conversion or digital-to-digital conversion to record digital data and/or digital-to-analog conversion or digital amplification to reproduce digital data.

One example of such conventional clock generators is shown in FIG. 3 hereof. The conventional clock generator is comprised of a reference quartz oscillator 8 built-in or modularly included in a body 7 of digital audio equipment for generating a clock signal required for operation of the digital audio equipment.

FIG. 4 shows another example of conventional clock generator 9 and a body 10 of digital audio equipment that are used in combination to form a digital audio system. Though not shown, the clock generator 9 has a built-in reference quartz oscillator or is constructed to accept the input of a reference signal from an external reference quartz oscillator, so that a clock signal required for operation of the digital audio equipment is generated by the clock generator 9 and supplied to the digital audio equipment body 10.

However, due to low frequency stability (or uncertainty) of the quartz oscillator, the conventional use of such quartz oscillators as reference oscillators raises a problem that sound, processed either in the form of digital or analog, involves very small fluctuations, which will lower the sound quality and eventually provide physiological discomfort and unnaturalness to human users. Through researches the present inventors have found that the sound quality is improved as the accuracy of an oscillator used increases. Based on this founding, an atomic clock (also called "atomic frequency standard"), which uses atoms of cesium, hydrogen or mercury and whose accuracy or uncertainty is remarkably higher than that of the conventional quartz oscillators, is used according to the present invention for the purpose of improving the sound quality in proportion to the frequency stability (uncertainty) of the atomic clock. Stated in other words, since the frequency stability of the conventional quartz oscillators is insufficient to perform analog-to-digital conversion, digital-to-digital conversion and digital-to-analog conversion, such conversion processes when effected necessarily involve generation of great jitter, failing to provide recorded or reproduced sounds with high sound quality and high fidelity. This may result in unsatisfactorily matched reality and presence.

Frequency stability (uncertainty) of the conventional quartz oscillators is normally of the order of from 1 to 100 parts in 10 to 4th (i.e., 0.0001 to 0.000001). On the other hand, the resolution of analog-to-digital converters, digital-to-digital converters or the digital-to-analog converters that can be used in digital audio equipment is usually expressed in bits. In case of a converter having a resolution of 16 bits, the least significant increment is $1/65{,}536$ since $2^{16}=65{,}536$. This means that the 16-bit converter requires frequency stability of less than $1/65{,}536$ so as to meet a necessary condition and of less than $1/66{,}000{,}000$ so as to meet a necessary and sufficient condition. In case of a converter having a resolution of 20 bits, the least significant increment is $1/1{,}048{,}576$, which will require frequency stability of less than $1/10{,}000{,}000$ to meet a necessary condition and of less than $1/10{,}000{,}000$ to meet a necessary and sufficient condition. Similarly, in case of a converter having a resolution of 24 bits, the least significant increment is $1/16{,}777{,}216$, which will require frequency stability of less than $1/170{,}000{,}000$ to meet a necessary condition and of less than $1/170{,}000{,}000$ to meet a necessary and sufficient condition.

It appears clear from the foregoing discussion that the frequency stability of the conventional quarts oscillators does not follow or support the resolutions of analog-to-digital converters, digital-to-digital converters and digital-to-analog converters used in the digital audio equipment. Accordingly, jitter of a digital signal produced after analog-to-digital conversion and a jitter caused in the digital-to-digital converter or the digital-to-analog converter may produce a noise, which will deteriorate sound resolution and thus hinder recording and/or reproduction of sound with high sound quality and high fidelity. The sound is rendered unnatural and, hence, satisfactorily matched reality and presence cannot be provided.

DISCLOSURE OF THE INVENTION

It is accordingly a general object of the present invention to solve the problems associated with the conventional quartz oscillator used as a reference oscillator.

A more specific object of the present invention is to provide a digital audio information recording and/or reproduction method which is capable of reducing jitters during analog-to-digital conversion, digital-to-digital conversion and digital-to-analog conversion, to thereby provide remarkably improved acoustic characteristics including reduced noise and improved sound resolution, thus obtaining a sound recorded or reproduced with high sound quality and high fidelity in a manner to provide satisfactorily matched reality and presence.

Another object of the invention is to provide an apparatus for carrying out the recording and/or reproduction method.

According to a first aspect of the present invention, there is provided a recording and reproducing method comprising the steps of: recording digital data through analog-to-digital conversion or digital-to-digital conversion while using a cesium atomic clock as a digital audio reference oscillator, and subsequently, reproducing the recorded digital data through digital-to-analog conversion or digital amplification while using the cesium atomic clock as the digital audio reference oscillator.

According to a second aspect of the present invention, there is provided a recording and reproducing method comprising the steps of: recording digital data through analog-to-digital conversion or digital-to-digital conversion while using a hydrogen atomic clock as a digital audio reference oscillator, and subsequently, reproducing the recorded digital data through digital-to-analog conversion or digital amplification while using the hydrogen atomic clock as the digital audio reference oscillator.

According to a third aspect of the present invention, there is provided a recording and reproducing method comprising the steps of: recording digital data through analog-to-digital conversion or digital-to-digital conversion while using a mercury atomic clock as a digital audio reference oscillator, and subsequently, reproducing the recorded digital data through digital-to-analog conversion or digital amplification while using the mercury atomic clock as the digital audio reference oscillator.

According to a fourth aspect of the present invention, there is provided a recording/reproduction method comprising the steps of: producing a clock signal based on a reference signal supplied from a reference oscillator consisting of a cesium atomic clock, a hydrogen atomic clock or a mercury atomic clock; and performing analog-to-digital conversion or digital-to-digital conversion on the basis of the clock signal to thereby record digital data.

According to a fifth aspect of the present invention, there is provided a recording/reproduction method comprising the steps of: producing a clock signal based on a reference signal supplied from a reference oscillator consisting of a cesium atomic clock, a hydrogen atomic clock or a mercury atomic clock; and performing digital-to-analog conversion or digital amplification on the basis of the clock signal to thereby reproduce digital data.

According to a sixth aspect of the present invention, there is provided a recording/reproduction method comprising the steps of: producing a clock signal based on a reference signal supplied from a reference oscillator consisting of a cesium atomic clock, a hydrogen atomic clock or a mercury atomic clock; performing analog-to-digital conversion or digital-to-digital conversion on the basis of the clock signal to thereby record digital data; and subsequently, performing digital-to-analog conversion or digital amplification on the basis of the clock signal to thereby reproduce the recorded digital data.

According to a seventh aspect of the present invention, there is provided a digital audio system comprising: an atomic clock as a reference oscillator for generating a reference signal, the atomic clock essentially consisting of one selected from the group of a cesium atomic clock, a hydrogen atomic clock and a mercury atomic clock; a clock generator for generating a clock signal on the basis of the reference signal supplied from the atomic clock; and digital audio equipment configured to record digital data through analog-to-digital conversion or digital-to-digital conversion and/or reproduce digital data through digital-to-analog conversion or digital amplification, both performed based on the clock signal supplied from the clock generator that is generated on the basis of the reference signal supplied from the atomic clock.

The atomic clock and the clock generator may be disposed either externally or internally of the digital audio equipment.

By using the excellent frequency stability (uncertainty) peculiar to the atomic clock, the methods and apparatus of the present invention can minimize jitter during analog-to-digital conversion, digital-to-digital conversion and digital-to-analog conversion to thereby provide remarkably improved acoustic characteristics including reduced noise and improved sound resolution, thus obtaining a sound recorded or reproduced with high sound quality and high fidelity in a manner to provide satisfactorily matched reality and presence.

When the cesium atomic clock is employed as the digital audio reference oscillator, the frequency stability (uncertainty) is less than 5 parts in 10 to 14th, i.e., 0.00000000000005, which satisfies the necessary frequency stability ($1/170,000,000$–$1/17,000,000,000$) for analog-to-digital, digital-to-digital and digital-to-analog converters having a resolution of 24 bits.

Alternatively, when the hydrogen atomic clock is used as the digital audio reference oscillator, the frequency stability (uncertainty) is less than 2 parts in 10 to 16th, i.e., 0.00000000000000002, which satisfies the necessary frequency stability ($1/170,000,000$–$1/17,000,000,000$) for analog-to-digital, digital-to-digital and digital-to-analog converters having a resolution of 24 bits.

In still another application where the mercury atomic clock is used as the digital audio reference oscillator, the frequency stability (uncertainty) is less than 1 part in 10 to 16th, i.e., 0.00000000000000001, which appears to satisfy the necessary frequency stability ($1/170,000,000$–$1/17,000,000,000$) for analog-to-digital, digital-to-digital and digital-to-analog converters having a resolution of 24 bits.

BEST MODE FOR CARRYING OUT THE INVENTION

Certain preferred embodiments of the present invention will be described below in greater detail with reference to the accompanying sheets of drawings.

Figure 1:
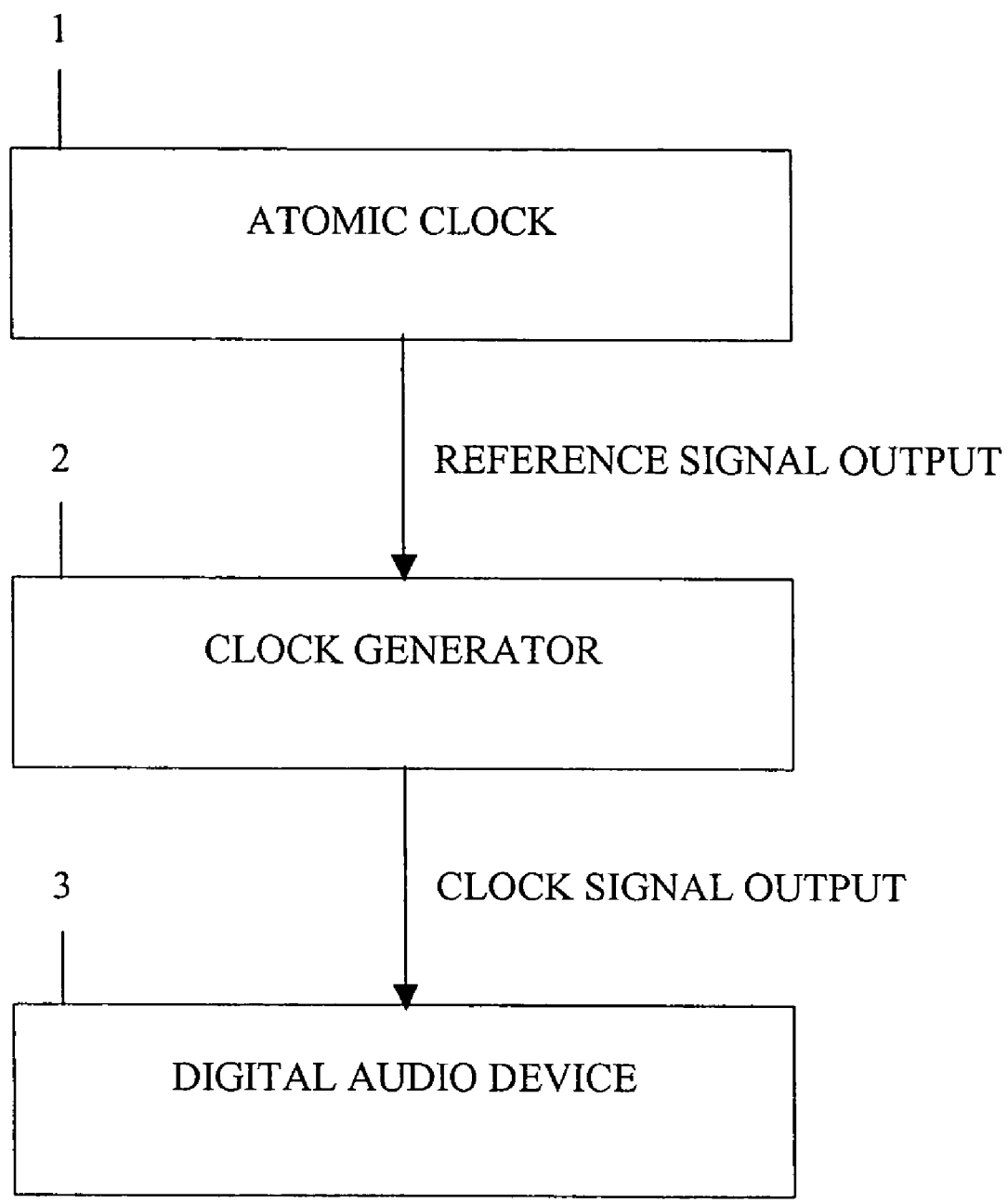
FIG. 1 is a block diagram showing the general arrangement of a digital audio system including an atomic clock for carrying out a recording and reproduction method according to the present invention.

FIG. 1 shows in block diagram a digital audio system configured to carry out a recording and reproduction method according to the present invention. As shown, the digital audio system generally comprises an atomic clock 1 as a reference oscillator, a clock generator 2, and a digital audio device or equipment 3. The atomic clock 1 and the clock generator 2 are disposed externally of the digital audio equipment 3.

The atomic clock 1 is also called "an atomic frequency standard" and configured to supply a reference signal of hyperfine frequency to the clock generator 2. In the illustrated embodiment, the atomic clock 1 is comprised of a cesium atomic clock, a hydrogen atomic clock, or a mercury atomic clock.

The clock generator 2 is configured to generate a clock signal for digital audio processing on the basis of the reference signal supplied from the atomic clock 1 and supplies the clock signal to the digital audio equipment 3.

The digital audio equipment 3 comprises a compact disk (CD) player, a digital video disk (DVD) player, a super audio compact disk (SACD) player, a digital audio tape (DAT), a mini disk (MD) player, an MD recorder, a magneto-optical (MO) recorder, a digital audio recording/editing/reproduction system using a computer, a digital tape recorder using tape media, an analog-to-digital (AD) converter, a digital-to-analog (DA) converter, a digital-to-digital (DD) converter, a digital audio word clock generator, a CD cutting machine system, a DVD authoring system, an SACD authoring system, a DVD cutting system, an SACD cutting system, a hard disk (HD) recorder, a memory recorder, a digital format converter, a digital surround system, a digital audio regulator, a digital reverb processor, and any other sort of digital audio system or equipment.

The digital audio equipment 3 is configured to record digital data through analog-to-digital (AD) conversion or digital-to-digital (DD) conversion and/or reproduce digital data through digital-to-analog (DA) conversion or digital amplification, both performed on the basis of the clock signal supplied from the clock oscillator 2 that is generated on the basis of the reference signal supplied from the atomic clock 1.

In the digital audio system shown in FIG. 1, when the cesium atomic clock is employed as the atomic clock 1 serving as a digital audio reference oscillator, the frequency stability (uncertainty) of the cesium atomic clock is less than 5 parts in 10 to 14th, i.e., 0.00000000000005, which satisfies the necessary frequency stability ($1/170{,}000{,}000 - 1/17{,}000{,}000{,}000$) for converters (analog-to-digital converter, digital-to-digital converter and digital-to-analog converter) having a resolution of 24 bits.

Alternatively, when the hydrogen atomic clock is used as the atomic clock 1, the frequency stability (uncertainty) of the hydrogen atomic clock is less than 2 parts in 10 to 16th, i.e., 0.0000000000000002, which appears to satisfy the necessary frequency stability ($1/170{,}000{,}000 - 1/17{,}000{,}000{,}000$) for those converters (analog-to-digital converter, digital-to-digital converter and digital-to-analog converter) having a resolution of 24 bits.

In still another application where the mercury atomic clock is used as the atomic clock 1, the frequency stability (uncertainty) is less than 1 part in 10 to 16th, i.e., 0.0000000000000001, which appears to satisfy the necessary frequency stability ($1/170{,}000{,}000 - 1/17{,}000{,}000{,}000$) for those converters (analog-to-digital converter, digital-to-digital converter and digital-to-analog converter) having a resolution of 24 bits.

It will be appreciated that by virtue of the excellent frequency stability (uncertainty) peculiar to a sort of atomic clock used, it is possible to minimize jitter during analog-to-digital conversion, digital-to-digital conversion and digital-to-analog conversion. This provides marked improvements in acoustic characteristics including jitter noise and sound resolution. A recorded or reproduced sound can thus be obtained with high sound quality and high fidelity which are comparable to those achieved in an analog audio system. The sound is natural and can provide satisfactorily matched reality and presence.

Another advantage attained by the method and apparatus of the present invention is that deterioration of digital signal data, which may occur when the digital signal data is subjected to recording or reproduction subsequent to digital conversion or when the digital signal data passes through a digital transmission system, can be neglected. This leads to a further improvement in the acoustic characteristics.

Figure 2:
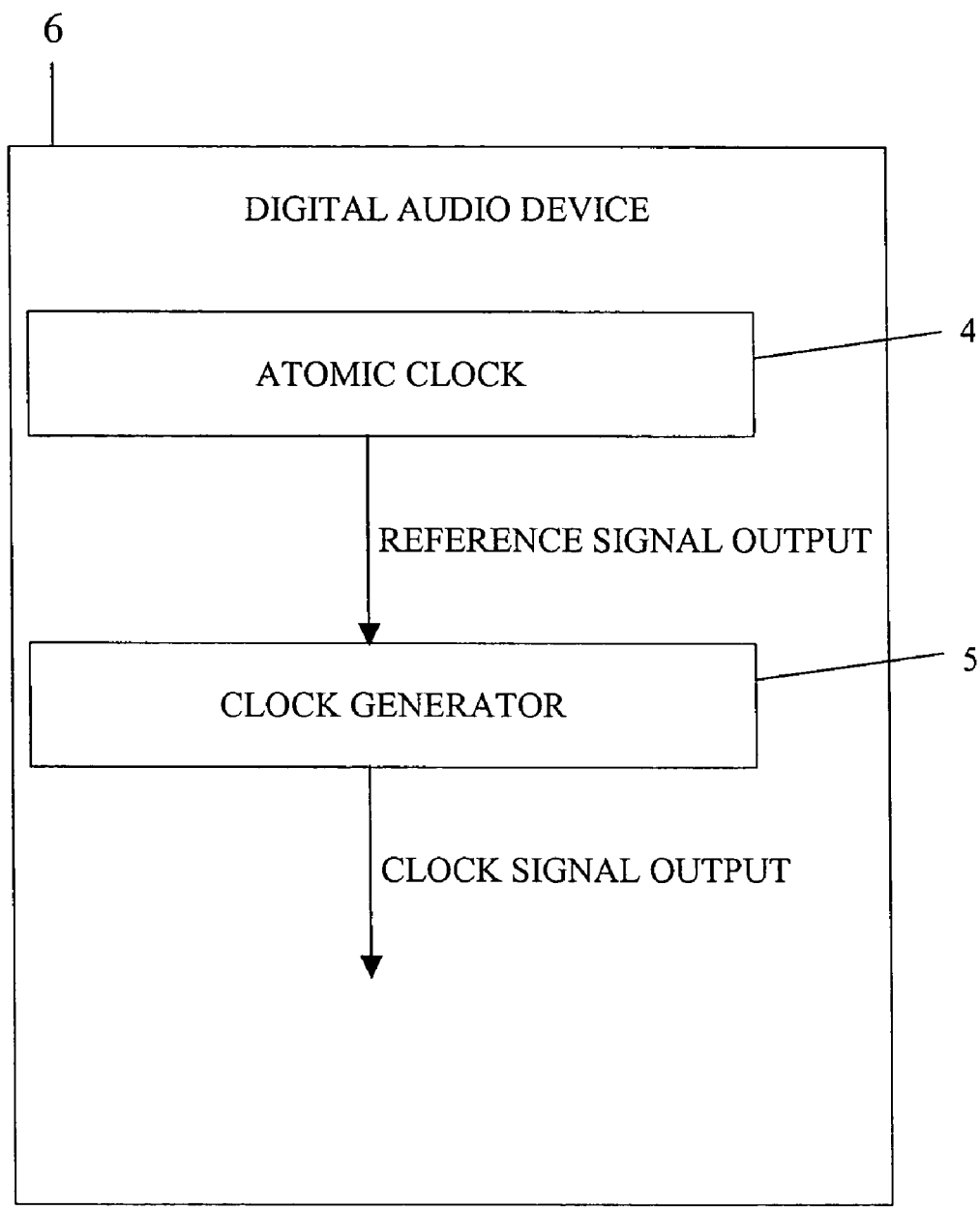
FIG. 2 is a block diagram showing another digital audio system configured to carry out the recording and reproduction method of the present invention.
Figure 3:
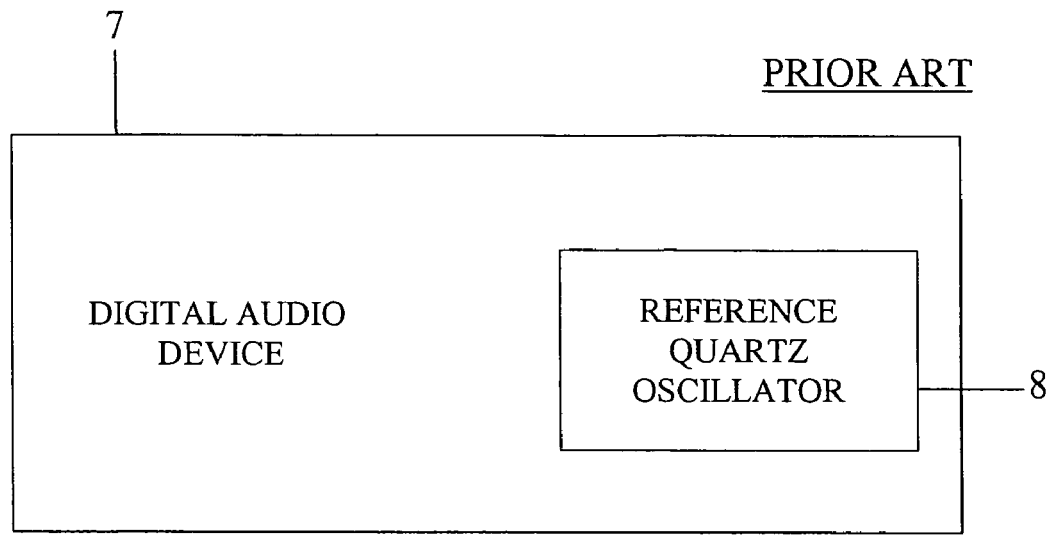
FIG. 3 is a block diagram showing the general arrangement of a conventional digital audio system.
Figure 4:
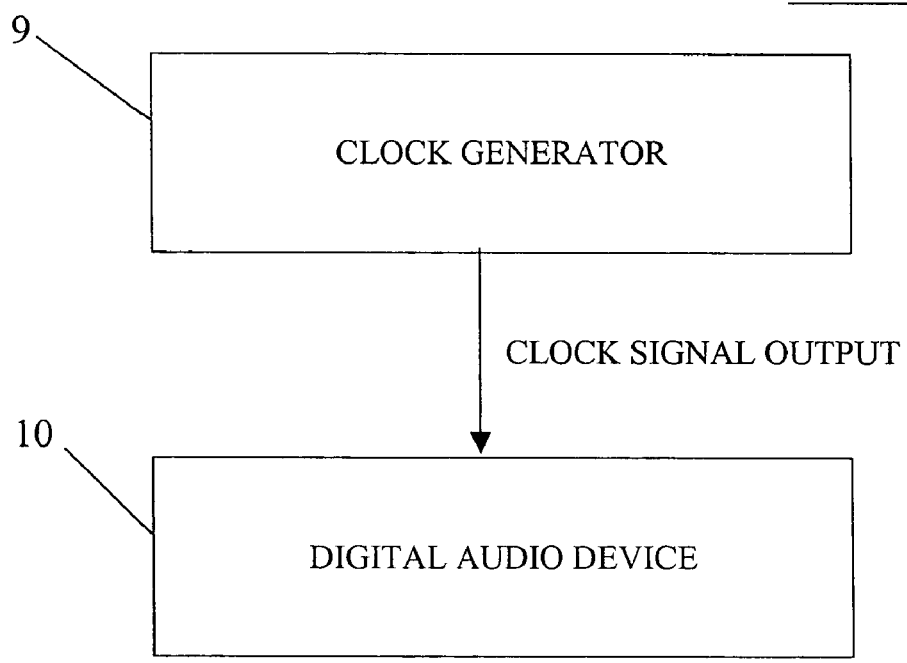
FIG. 4 is a block diagram showing another conventional digital audio system.

FIG. 2 shows in block diagram another digital audio system configured to carry out the recording and reproduction method of the present invention. The digital audio system generally comprises an atomic clock 4, a clock generator 5, and a digital audio device or equipment 6. The digital audio system shown in FIG. 2 differs from the one shown in FIG. 1 in that the atomic clock 1 and the clock generator 2 are disposed internally of the digital audio equipment 6 as built-in or modularly included components of the digital audio equipment 6.

The atomic clock (or atomic frequency standard) 4 comprises a cesium atomic clock, a hydrogen atomic clock, or a mercury atomic clock and is configured to supply a reference signal of hyperfine frequency to the clock generator 5.

The clock generator 5 is configured to generate a clock signal for digital audio processing on the basis of the reference signal supplied from the atomic clock 4 and supplies the clock signal to the digital audio equipment 6.

The digital audio equipment 6 comprises all the digital audio systems or equipment as specified above, namely, a CD player, a DVD player, an SACD player, a DAT, an MD player, an MD recorder, an MO recorder, a digital audio recording/editing/reproduction system using a computer, a digital tape recorder using tape media, an AD converter, a DA converter, a DD converter, a digital audio word clock generator, a CD cutting machine system, a DVD authoring system, an SACD authoring system, a DVD cutting system, an SACD cutting system, an HD recorder, a memory recorder, a digital format converter, a digital surround system, a digital audio regulator, and a digital reverb processor.

Operation and advantageous effect achieved by the digital audio system of FIG. 2 are substantially the same as those described above with respect to the digital audio system shown in FIG. 1, and further description thereof can be omitted.

INDUSTRIAL APPLICABILITY

With the arrangements so far described, the present invention can be used advantageously as a method of and an apparatus for recording and/or reproducing digital audio information with high sound quality and high fidelity.

The invention claimed is:

1. A high fidelity and high sound quality digital audio recording and reproducing method comprising the steps of:
   recording digital audio data through analog-to-digital conversion or digital-to-digital conversion while using the excellent frequency stability peculiar to a cesium atomic clock employed as a singular digital audio reference oscillator, and
   subsequently, reproducing the recorded digital audio data through digital-to-analog conversion or digital amplification while using the excellent frequency stability peculiar to the cesium atomic clock employed as a singular digital audio reference oscillator.

2. A high fidelity and high sound quality digital audio recording and reproducing method comprising the steps of:
   recording digital audio data through analog-to-digital conversion or digital-to-digital conversion while using the excellent frequency stability peculiar to a hydrogen atomic clock employed as a singular digital audio reference oscillator, and
   subsequently, reproducing the recorded digital audio data through digital-to-analog conversion or digital amplification while using the excellent frequency stability peculiar to the hydrogen atomic dock employed as a singular digital audio reference oscillator.

3. A high fidelity and high sound quality digital audio recording and reproducing method comprising the steps of:
   recording digital audio data through analog-to-digital conversion or digital-to-digital conversion using the excellent frequency stability peculiar to a mercury atomic clock employed as a singular digital audio reference oscillator, and
   subsequently, reproducing the recorded digital audio data through digital-to-analog conversion or digital amplification while using the excellent frequency stability peculiar to the mercury atomic clock employed as a singular digital audio reference oscillator.

4. A high fidelity and high sound quality digital audio system comprising:
- a singular digital audio reference oscillator in the form of an atomic clock for generating a digital audio reference signal, the atomic clock being selected from the group consisting of a cesium atomic clock, a hydrogen atomic clock, and a mercury atomic clock which have a peculiarity of excellent frequency stability;
- a digital audio clock signal generator operatively connected to the digital audio reference oscillator for generating a digital audio clock signal on the basis of the reference signal supplied from the atomic clock; and
- digital audio equipment operatively connected to the digital audio clock signal generator and configured to record digital audio data through analog-to-digital conversion or digital-to-digital conversion and/or reproduce digital audio data through digital-to-analog conversion or digital amplification, both performed based on the digital audio clock signal supplied from the digital audio clock generator.

5. A high fidelity and high sound quality digital audio system according to claim 4, wherein the digital audio reference oscillator and the digital audio clock signal generator are disposed externally of the digital audio equipment.

6. A high fidelity and high sound quality digital audio system according to claim 4, wherein the digital audio reference oscillator and the digital audio clock signal generator are disposed internally of the digital audio equipment.

* * * * *